(12) United States Patent
Chiba et al.

(10) Patent No.: US 11,456,271 B2
(45) Date of Patent: Sep. 27, 2022

(54) NOBLE METAL-COATED SILVER WIRE FOR BALL BONDING AND METHOD FOR PRODUCING THE SAME, AND SEMICONDUCTOR DEVICE USING NOBLE METAL-COATED SILVER WIRE FOR BALL BONDING AND METHOD FOR PRODUCING THE SAME

(71) Applicant: TANAKA DENSHI KOGYO K.K., Saga-ken (JP)

(72) Inventors: Jun Chiba, Saga-ken (JP); Yuki Antoku, Saga-ken (JP); Shota Kawano, Saga-ken (JP)

(73) Assignee: TANAKA DENSHI KOGYO K.K., Saga-Ken (JP)

( * ) Notice: Subject to any disclaimer, the term of this patent is extended or adjusted under 35 U.S.C. 154(b) by 28 days.

(21) Appl. No.: 16/969,357

(22) PCT Filed: Apr. 19, 2018

(86) PCT No.: PCT/JP2018/016173
§ 371 (c)(1),
(2) Date: Aug. 12, 2020

(87) PCT Pub. No.: WO2019/193770
PCT Pub. Date: Oct. 10, 2019

(65) Prior Publication Data
US 2021/0050321 A1 Feb. 18, 2021

(30) Foreign Application Priority Data
Apr. 2, 2018 (JP) .............................. JP2018-070807

(51) Int. Cl.
*H01L 23/00* (2006.01)

(52) U.S. Cl.
CPC .............. *H01L 24/45* (2013.01); *H01L 24/05* (2013.01); *H01L 24/48* (2013.01); *H01L 24/49* (2013.01);
(Continued)

(58) Field of Classification Search
None
See application file for complete search history.

(56) References Cited

U.S. PATENT DOCUMENTS 9,543,266 B2 1/2017 Yamada et al.
2015/0322586 A1* 11/2015 Lyn ..................... C23C 18/1633
428/673

(Continued)

FOREIGN PATENT DOCUMENTS

JP 2004-014884 A 1/2004
JP 2013-033811 A 2/2013
(Continued)

OTHER PUBLICATIONS

PCT/ISA/210, "International Search Report for International Application No. PCT/JP2018/16173," dated Jul. 17, 2018.

*Primary Examiner* — Nishath Yasmeen
(74) *Attorney, Agent, or Firm* — Manabu Kanesaka

(57) ABSTRACT

A noble metal-coated silver bonding wire suppresses corrosion at the bonding interface under severe conditions of high temperature and high humidity, and the noble metal-coated silver bonding wire can be ball-bonded in the air. The noble metal-coated silver wire for ball bonding is a noble metal-coated silver wire including a noble metal coating layer on a core material made of pure silver or a silver alloy, wherein the wire contains at least one sulfur group element, the noble metal coating layer includes a palladium intermediate layer and a gold skin layer, the palladium content relative to the entire wire is 0.01 mass % or more and 5.0 mass % or less, the gold content relative to the entire wire is 1.0 mass % or (Continued)

more and 6.0 mass % or less, and the sulfur group element content relative to the entire wire is 0.1 mass ppm or more and 100 mass ppm or less.

10 Claims, 2 Drawing Sheets

(52) U.S. Cl.
CPC .... *H01L 24/85* (2013.01); *H01L 2224/04042* (2013.01); *H01L 2224/05624* (2013.01); *H01L 2224/43825* (2013.01); *H01L 2224/45139* (2013.01); *H01L 2224/45147* (2013.01); *H01L 2224/45572* (2013.01); *H01L 2224/45573* (2013.01); *H01L 2224/45601* (2013.01); *H01L 2224/45644* (2013.01); *H01L 2224/45664* (2013.01); *H01L 2224/48137* (2013.01); *H01L 2224/48145* (2013.01); *H01L 2224/48175* (2013.01); *H01L 2224/48227* (2013.01); *H01L 2224/48464* (2013.01); *H01L 2224/48465* (2013.01); *H01L 2224/49109* (2013.01); *H01L 2224/85035* (2013.01); *H01L 2224/85203* (2013.01); *H01L 2224/85205* (2013.01)

(56) References Cited

U.S. PATENT DOCUMENTS

2016/0104687 A1* 4/2016 Yamada ................. H01L 24/43
　　　　　　　　　　　　　　　　　　　　　174/126.1
2017/0365576 A1　12/2017　Oyamada et al.

FOREIGN PATENT DOCUMENTS

| JP | 2016-115875 A | 6/2016 |
| WO | 2015/115241 A1 | 8/2015 |
| WO | 2015/152197 A1 | 10/2015 |

\* cited by examiner

NOBLE METAL-COATED SILVER WIRE FOR BALL BONDING AND METHOD FOR PRODUCING THE SAME, AND SEMICONDUCTOR DEVICE USING NOBLE METAL-COATED SILVER WIRE FOR BALL BONDING AND METHOD FOR PRODUCING THE SAME

RELATED APPLICATIONS

The present application is National Phase of International Application No. PCT/JP2018/016173 filed Apr. 19, 2018, and claims priority from Japanese Application No. 2018-070807, filed Apr. 2, 2018, the disclosure of which is hereby incorporated by reference herein in its entirety.

TECHNICAL FIELD

The present invention relates to a noble metal-coated silver wire for ball bonding suitable for a semiconductor device in which electrodes of a semiconductor chip and electrodes of lead frames or the like are connected by a bonding wire and a method for producing the same, as well as a semiconductor device using the wire and a method for producing the same.

BACKGROUND ART

Conventionally, gold wires, copper wires, coated copper wires, and silver wires have been used as ball bonding wires for connecting electrodes of a semiconductor chip and external leads or the like in semiconductor devices. In the ball bonding wire, one end of the wire is melted by electric discharge, becomes spherical due to surface tension, and is solidified. The solidified ball is called a free air ball (FAB) and is connected to an electrode of a semiconductor chip by an ultrasonic thermocompression bonding method. The other end of the wire is connected to an electrode of a printed circuit board, a lead frame, or the like. Then, the connected bonding wires are resin-sealed to form a semiconductor device.

Gold wires, which are conventional bonding wires, have a high material cost, and copper wires and coated copper wires have a problem that their hard materials damage semiconductor chips. Silver wires are inexpensive and soft and are thus suitable as bonding wires. However, pure silver wires had a problem that their surfaces were sulfurized when they were left in the air for a long period of time, and silver alloy wires had a problem that electric resistivity increased when pure silver was alloyed with palladium or gold.

Accordingly, in order to solve the above problems, a coated silver bonding wire obtained by coating the surface of a silver wire with a platinum group metal such as palladium was proposed. The coated silver bonding wire solved the problem of sulfurization of the surface of the bonding wire; however, this wire was not satisfactory in terms of bonding reliability compared with gold wires, for use in a severe environment of high temperature and high humidity in automobiles and the like.

For example, JP2013-033811A (Patent Document 1, described later) has proposed a palladium-coated silver bonding wire. The micrographs of FIGS. 4 (a) and (b) of this document show spherical balls having no unmelted portion of a palladium layer on the FAB surface. Claim 1 of this document describes "a bonding wire (W) for connecting an electrode (a) of a semiconductor element and a conductor wire (c) of a circuit wiring board by a ball bonding method, wherein a coating layer (2) of Pt or Pd is formed on the outer peripheral surface of a core material (1) made of Ag, and the ratio of the cross-sectional area (At) of the coating layer (2) and the cross-sectional area (A) of the wire (W) (At/A×100) is 0.1 to 0.6%."

Further, paragraph [0021] of this document indicates that "in the production of FAB, when the wire tip is melted by electric discharge between the wire tip and the discharge rod g, Au, Pt, or Pd, all of which have higher melting points than Ag, is accumulated on the FAB surface; thus, the surface of FAB (ball b) becomes a high-concentration layer of Au, Pt, or Pd, and contributes to an increase in reliability at the bonding interface with the electrode a during the subsequent first bonding in FIG. 2 (b)." However, since the coating layer of Pt or Pd was melted into FAB, even if Au, Pt, or Pd added to the core material was accumulated on the FAB surface to form a high-concentration layer, the high-concentration layer did not secure long-term reliability at the bonding interface at a high temperature and a high humidity.

Accordingly, claim 4 of JP2016-115875A (Patent Document 2, described later) discloses "a bonding wire for a semiconductor device, comprising an Au-containing region containing 15 to 50 at. % Au and provided on an outermost surface of the coating layer, wherein a thickness of the Au-containing region is 0.001 to 0.050 μm" . . . (omitted) . . . "comprising a core material containing one or more of Ga, In, and Sn for a total of 0.1 to 3.0 at % and a balance being made up of Ag and incidental impurities, and a coating layer formed over a surface of the core material containing one or more of Pd and Pt, or Ag and one or more of Pd and Pt, and a balance being made up of incidental impurities; wherein the coating layer is 0.005 to 0.070 μm in thickness." However, when Ga, In, and Sn were added to the core material, there was a problem that the electric resistivity of the bonding wire itself increased, and this wire was not satisfactory as a palladium-coated silver bonding wire.

In addition to the above problems, when a silver bonding wire formed a molten ball in the air, the molten silver ball absorbed oxygen in the air and released the absorbed oxygen during solidification, thereby leading to a phenomenon in which the FAB surface had a rough skin (spitting phenomenon). Therefore, when the silver bonding wire was thermocompression-bonded to an aluminum pad, which was an electrode of a semiconductor chip, the bonding interface between the aluminum pad and FAB was less likely to be bonded, and the silver bonding wire was forced to be ball-bonded in an inert atmosphere or a reducing atmosphere, and could not be ball-bonded in the air.

PRIOR ART DOCUMENTS

Patent Documents

[Patent Document 1] JP2013-033811A
[Patent Document 2] JP2016-115875A

SUMMARY OF THE INVENTION

Problem to Be Solved by the Invention

In a semiconductor device in which electrodes of a semiconductor chip and electrodes of lead frames or the like are connected by a bonding wire, when a noble metal-coated silver wire for ball bonding and an aluminum pad, which is the electrode of the semiconductor chip, are ball-bonded, corrosive intermetallic compounds of silver and aluminum are formed at the bonding interface. Since the intermetallic compounds easily corrode, corrosion penetrates into the bonding interface with time, and finally, a corrosion layer is formed between the aluminum pad and the bonding wire, thereby causing energization failure. Accordingly, an object of the present invention is to provide a noble metal-coated silver bonding wire that suppresses corrosion at the bonding interface and does not cause energization failure even under severe conditions of high temperature and high humidity in automobiles and the like. Further, another object of the present invention is to provide a noble metal-coated silver bonding wire that can be ball-bonded in the air.

Means for Solving the Problem

The noble metal-coated silver wire for ball bonding according to the present invention is a noble metal-coated silver wire including a noble metal coating layer on a core material made of pure silver or a silver alloy, wherein the wire contains at least one sulfur group element, the noble metal coating layer includes a palladium intermediate layer and a gold skin layer, the palladium content relative to the entire wire is 0.01 mass % or more and 5.0 mass % or less, the gold content relative to the entire wire is 1.0 mass % or more and 6.0 mass % or less, and the sulfur group element content relative to the entire wire is 0.1 mass ppm or more and 100 mass ppm or less.

The method for producing a noble metal-coated silver wire for ball bonding according to the present invention is a method for producing a noble metal-coated silver wire including a noble metal coating layer on a core material made of pure silver or a silver alloy, wherein the wire contains at least one sulfur group element, the noble metal coating layer includes a palladium intermediate layer and a gold skin layer, the palladium content relative to the entire wire is 0.01 mass % or more and 5.0 mass % or less, the gold content relative to the entire wire is 1.0 mass % or more and 6.0 mass % or less, and the sulfur group element content relative to the entire wire is 0.1 mass ppm or more and 100 mass ppm or less.

The semiconductor device using a noble metal-coated silver wire for ball bonding according to the present invention is a semiconductor device including at least one semiconductor chip, and a lead frame or a substrate, an electrode of the semiconductor chip and an electrode of the lead frame, the electrode of the semiconductor chip and an electrode of the substrate, or electrodes of multiple semiconductor chips being connected by a noble metal-coated silver wire for ball bonding, wherein the noble metal-coated silver wire for ball bonding includes a noble metal coating layer on a core material made of pure silver or a silver alloy, the wire contains at least one sulfur group element, the noble metal coating layer includes a palladium intermediate layer and a gold skin layer, the palladium content relative to the entire wire is 0.01 mass % or more and 5.0 mass % or less, the gold content relative to the entire wire is 1.0 mass % or more and 6.0 mass % or less, and the sulfur group element content relative to the entire wire is 0.1 mass ppm or more and 100 mass ppm or less.

The method for producing a semiconductor device using a noble metal-coated silver wire for ball bonding according to the present invention is a method for producing a semiconductor device including at least one semiconductor chip, and a lead frame or a substrate, an electrode of the semiconductor chip and an electrode of the lead frame, the electrode of the semiconductor chip and an electrode of the substrate, or electrodes of multiple semiconductor chips being connected by a noble metal-coated silver wire for ball bonding, wherein the noble metal-coated silver wire for ball bonding includes a noble metal coating layer on a core material made of pure silver or a silver alloy, the wire contains at least one sulfur group element, the noble metal coating layer includes a palladium intermediate layer and a gold skin layer, the palladium content relative to the entire wire is 0.01 mass % or more and 5.0 mass % or less, the gold content relative to the entire wire is 1.0 mass % or more and 6.0 mass % or less, and the sulfur group element content relative to the entire wire is 0.1 mass ppm or more and 100 mass ppm or less.

Effects of the Invention

The present invention can provide a noble metal-coated silver bonding wire that suppresses corrosion at the bonding interface even under severe conditions of high temperature and high humidity in automobiles and the like and does not cause energization failure in a semiconductor device in which electrodes of a semiconductor chip and electrodes of lead frames or the like are connected by a bonding wire. Further, in the present invention, the molten silver balls do not absorb oxygen from the air, and the bonding operation can be performed in the air even when the core material is made of pure silver with a purity of 99.9 mass % or more, or a silver alloy. Therefore, existing gold wire bonding devices can be used as they are, and a noble metal-coated silver wire can be provided as an alternative to gold bonding wires.

MODE FOR CARRYING OUT THE INVENTION

Embodiments of the present invention will be described below. The embodiments shown below are intended to embody the technical idea of the present invention, and the present invention is not limited to the following examples.

In the present invention, a noble metal coating layer contains a sulfur group element that has a lower melting point than those of gold and palladium, which form the noble metal coating layer, and that is highly reactive with silver, whereby a gold-palladium distribution layer can stably remain on the FAB surface during ball bonding. That is, the presence of the gold-palladium distribution layer at the bonding interface between FAB and the aluminum pad can suppress an increase in electric resistance, i.e., energization failure, caused by corrosion that occurs under the influence of water and halogen ions over a long period of time. The sulfur group elements are sulfur (S), selenium (Se), and tellurium (Te).

The melting points of the sulfur group elements are as follows: sulfur (S): 113° C., selenium (Se): 220° C., and tellurium (Te): 450° C., all of which are lower than the melting point of silver (962° C.). Further, the melting points of the sulfur group elements are lower than the melting points of palladium (1,552° C.) and gold (1,064° C.), which form the noble metal coating layer.

Figure 1:
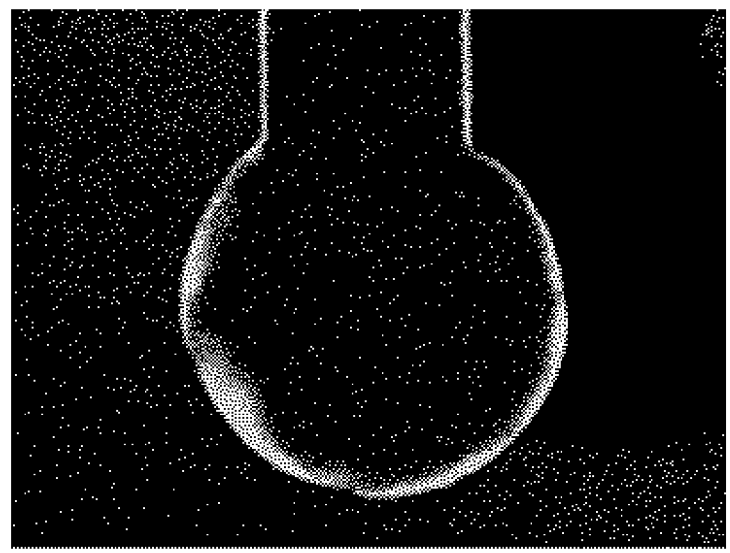
FIG. 1 is a cross-sectional view of FAB in which a gold-palladium distribution layer is formed.

Although the mechanism of the characteristics of the present invention has not been completely clarified, it is presumed that the process of forming molten balls is characteristic. Therefore, the FAB formation process will be explained in the time sequence. First, when the bonding wire is heated, the sulfur group element in the noble metal coating layer with the lowest melting point becomes molten. Since the sulfur group element easily reacts with the silver of the core material, the molten sulfur group element is attracted to the silver. Next, the silver of the core material with the next lowest melting point melts and grows from small balls to large balls. At that time, at the interface between the silver of the core material and the palladium of the noble metal coating layer, the silver on the outermost surface of the core material reacts with the sulfur group element to form sulfurized silver (e.g., silver sulfide), which covers the periphery of the outermost surface of the silver of the core material. The sulfurized silver exerts a barrier effect between the silver of the core material and the palladium of the noble metal coating layer to suppress the gold and palladium of the noble metal coating layer from melting into the silver of the core material even if the heating temperature increases to the melting points of gold and palladium. Since the palladium of the noble metal coating layer is partially alloyed with the silver on the surface of the core material, palladium or a palladium-silver alloy, or both of them, are formed on the FAB surface to cover the FAB surface, although they are not completely separated. On the other hand, gold has the property of being difficult to diffuse into palladium, and the gold skin layer of the noble metal coating layer thus remains on the palladium intermediate layer. Then, the gold skin layer and the palladium intermediate layer are partially alloyed at their interface, and the gold skin layer follows the movement of the palladium intermediate layer. This layer is called a gold-palladium distribution layer, and this gold-palladium distribution layer further covers the FAB surface. FIG. 1 shows the results of area analysis of a cross section of FAB in which a gold-palladium distribution layer is formed.

The gold-palladium distribution layer on the FAB surface can be confirmed, for example, by performing area analysis of a surface obtained by cutting the FAB center from the wire neck toward the ball tip using an electron probe micro-analyzer (EPMA). Area analysis is a method of measuring the element distribution within a certain range of a sample and is an analysis method that allows for visual recognition of the distribution of each element. FIG. 1 shows the results of area analysis for the distribution of palladium in the FAB cross-section by the EPMA. The white areas show the distribution of gold and palladium, indicating that a gold-palladium distribution layer is formed on the FAB surface. In addition, a thin gold-palladium distribution layer, which is difficult to measure with the EPMA, cannot be subjected to visual area analysis; however, the formation of a gold-palladium distribution layer can be confirmed by performing depth analysis from the FAB surface toward the core material by Auger electron spectroscopy (AES). In addition, a palladium distribution layer can also be confirmed, for example, by energy-dispersive X-ray spectroscopy (EDX) attached to a transmission electron microscope (TEM). The distribution of gold and palladium on the FAB surface as described above is defined as a gold-palladium distribution layer.

Figure 2:
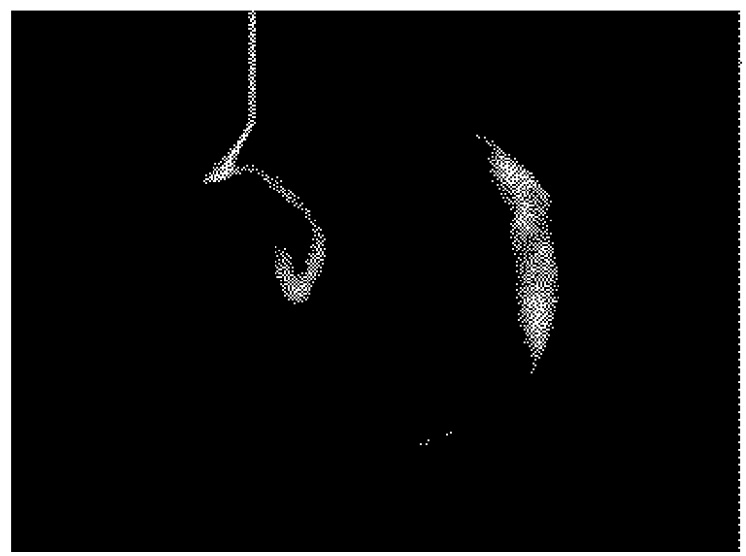
FIG. 2 is a cross-sectional view of FAB in which a gold-palladium distribution layer is not formed.

The requirement for solving the problems of the present invention is that the gold-palladium distribution layer covers the FAB surface. Since the gold-palladium distribution layer suppresses the permeation of oxygen in the air, it is possible to prevent the molten silver balls from absorbing oxygen. Therefore, oxygen is not released when FAB is solidified, and thus the spitting phenomenon does not occur. Further, by covering the FAB surface, the gold-palladium distribution layer always exists at the bonding interface with the aluminum pad, and it is possible to suppress an increase in electric resistance, i.e., energization failure, caused by corrosion at the bonding interface. In FIG. 2, gold and palladium are melted into the silver of the core material, and the problems of the present invention cannot be solved in this state.

Moreover, in the noble metal-coated silver wire for ball bonding according to the present invention, because a gold skin layer is coated as the outermost layer of the noble metal coating layer (in particular, when a hard palladium intermedium layer is coated), the high malleability of gold makes it possible to prevent cracks and breaks on the wire surface during wire drawing. In addition, the wear on the diamond die is reduced, which can extend the life of the die and contribute to a reduction in processing costs.

Further, in the noble metal coating layer, it is preferable that a gold intermediate layer is formed on the core material surface of the palladium intermediate layer. This is because the gold intermediate layer serves as a cushion to mitigate the difference in elongation rate between the core material and the palladium intermediate layer in the continuous wire drawing process. In addition, when gold, palladium, and gold are coated in this order in the noble metal coating layer, wire drawing defects of the noble metal coating layer in the continuous wire drawing process are reduced.

Furthermore, in the noble metal-coated silver bonding wire for ball bonding according to the present invention, it is preferable to use silver with a purity of 99.9 mass % or more as the core material because the electric resistivity of the wire can be reduced. However, since there is a large difference in material strength, malleability, and elongation between silver and the noble metal coating layer, it may cause the noble metal coating layer to peel off from the silver of the core material during wire drawing or cause a wire breakage or the like. Therefore, it has been found that in order to perform wire drawing smoothly, when a small amount of copper is mixed with the silver of the core material to increase the strength of the core material, the difference in material strength and elongation between the noble metal coating layer and the core material is reduced, and the workability during wire drawing is improved. The same effect can be obtained by adding gold, platinum, palladium, or the like to the core material.

In the noble metal-coated silver bonding wire according to the present invention, the palladium content relative to the entire wire is set to 0.01 mass % or more and 5.0 mass % or less for the following reasons. That is, the reason why the lower limit of the palladium content is set to 0.01 mass % or more is that if the palladium content is less than 0.01 mass %, the FAB surface cannot be covered with a gold-palladium distribution layer, and corrosion cannot be suppressed at the bonding interface between FAB and the aluminum pad. Further, the reason why the upper limit of the palladium content is set to 5.0 mass % or less is that the circularity of FAB cannot be stabilized if the palladium content exceeds 5.0 mass %.

In the noble metal-coated silver bonding wire according to the present invention, the gold content relative to the entire wire is set to 1.0 mass % or more and 6.0 mass % or less for the following reasons. That is, the reason why the lower limit of the gold content is set to 1.0 mass % or more is that if the gold content is less than 1.0 mass %, it is impossible to prevent oxygen from entering the molten balls from the air and to suppress the spitting phenomenon. Further, the reason why the upper limit of the gold content is set to 6.0 mass % or less is that the circularity of the pressure-bonded balls cannot be stabilized if the gold content exceeds 6.0 mass %. However, the gold content is preferably as low as possible, because a higher gold content results in a higher cost.

In the noble metal-coated silver bonding wire according to the present invention, the reason why the noble metal coating layer contains a sulfur group element is that it has been found that the FAB surface can be covered with a gold-palladium distribution layer when at least one sulfur group element selected from sulfur (S), selenium (Se), and tellurium (Te) is present in an appropriate amount depending on the component composition of the noble metal coating layer. Although the problems of the present invention can be solved by incorporating a sulfur group element into the noble metal coating layer, it is difficult to analyze whether the noble metal coating layer contains a sulfur group element, and it is also very difficult to analyze the sulfur group element content of the noble metal coating layer. Therefore, the claims specify the sulfur group element content relative to the entire wire.

The reason why the lower limit of the sulfur group element content is set to 0.1 mass ppm or more is that the gold-palladium distribution layer cannot remain on the FAB surface if the sulfur group element content is less than 0.1 mass ppm. Further, the reason why the upper limit of the sulfur group element content is set to 100 mass ppm or less is that the circularity of the ball bonding portion cannot be stabilized during ball bonding if the sulfur group element content exceeds 100 mass ppm.

The silver alloy of the core material preferably contains 0.005 mass % or more and 2.0 mass % or less of copper. The reason why the lower limit of the copper content relative to the entire wire is set to 0.005 mass % or more is that wire drawing defects cannot be suppressed if the copper content is less than 0.005 mass %. Further, the reason why the upper limit of the copper content relative to the entire wire is set to less than 2.0 mass % is that if the copper content exceeds 2.0 mass %, the electric resistivity increases and further the wire strength increases, making wire drawing difficult. The same effect can be obtained when the silver alloy of the core material contains at least one of gold, platinum, or palladium in a total amount of 0.005 mass % or more and 2.0 mass % or less.

The content of each element in the noble metal-coated silver bonding wire for ball bonding according to the present invention is measured by inductively coupled plasma atomic emission spectroscopy (ICP-AES), inductively coupled plasma mass spectrometry (ICP-MS), glow discharge mass spectrometry (GDMS), time-of-flight secondary ion mass spectrometry (TOF-SIMS), or the like.

Regarding the structure of the noble metal coating layer laminated on the core material in the noble metal-coated silver bonding wire for ball bonding according to the present invention, the order of lamination can be confirmed by AES analysis in the depth direction from the surface layer of the bonding wire to the core material. In addition, the lamination and arrangement of each element can also be confirmed by obtaining a cross section of the bonding wire by mechanical polishing or using a focused ion beam system (FIB), and performing line analysis of elements in the surface portion or point analysis of multiple points using EDX attached to a scanning electron microscope (SEM), EPMA, or EDX attached to TEM.

In the present invention, the noble metal element in the noble metal coating layer, the palladium element in the intermediate palladium layer, and the gold element in the gold skin layer and the intermediate gold layer may be alloyed in each layer without a portion of 100 mass % of each element. They are defined as the noble metal coating layer, the intermediate palladium layer, the gold skin layer, and the intermediate gold layer, including the above cases.

(Production Method)

Next, the method for producing a noble metal-coated silver bonding wire for ball bonding according to the present invention will be described. The method for producing a noble metal-coated silver bonding wire for ball bonding according to the embodiment is not particularly limited to the following.

(Core Material)

The pure silver or silver alloy used in the core material of the bonding wire can be produced by melting raw materials simultaneously. An arc heating furnace, a high-frequency heating furnace, a resistance heating furnace, or the like can be used for melting. It is preferable to use a continuous casting furnace. The procedure is as follows. Pre-weighed raw materials are placed in a carbon crucible, heated and melted in a vacuum or an inert atmosphere, such as nitrogen gas or argon gas, and then cooled. The obtained pure silver or silver alloy ingot is formed into a thin wire with a final wire diameter by repeating rolling, drawing using a die, and continuous wire drawing.

(Noble metal coating layer)

The method for forming a noble metal coating layer is a method in which a noble metal coating layer is formed on a silver wire with a final wire diameter, or a method in which a noble metal coating layer is formed on a silver wire after continuous casting or a silver wire with an intermediate wire diameter, followed by continuous drawing to process the wire to a final wire diameter.

The method for forming a noble metal coating layer on the surface of a silver wire, which is the core material, may be a wet plating method, a dry plating method, a melting method, or the like. As the wet plating method, an electrolytic plating method, an electroless plating method, or the like can be used for production. It is also possible to combine an electrolytic plating method called strike plating or flash plating. The solution used for electroless plating may be substitution type, reduction type, or self-decomposition type. To form a thick noble metal coating layer, self-decomposition plating can be used in combination after substitution plating. As the dry plating method, physical adsorption such as sputtering, ion plating, and vacuum deposition, and chemical adsorption such as plasma chemical vapor deposition (CVD), can be used. Since all of these methods are dry plating, there is no need for cleaning after forming a noble metal coating layer, as there is in wet plating, and there is no concern about surface contamination during cleaning.

The method for forming the silver wire described above will be described in detail. A cylindrical silver alloy with a diameter of 3 mm or more and 10 mm or less obtained by melt casting is drawn to a diameter of 1.2 mm or more and 2.0 mm or less. Then, wire drawing is continuously performed using a die to produce a wire with a diameter of 300 μm or more and 600 μm or less. These steps can also be performed by continuous casting.

The method for forming a noble metal coating layer on the silver wire will be described in detail. The noble metal coating layer can be formed by wet plating. Preparation is performed by adding a sulfur (S) compound, a selenium (Se) compound, or a tellurium (Te) compound as a crystal modifier to a palladium electroplating bath for a palladium intermediate layer. Further, a gold electroplating bath is used when a gold skin layer is provided. Then, wire drawing is repeated to draw the wire to a final wire diameter of 12 μm or more and 60 μm or less, preferably 15 μm or more and 35 μm or less, and a final heat treatment is performed.

It is effective to perform the final heat treatment while continuously drawing the noble metal-coated silver wire with the final wire diameter because high productivity can be obtained. Specifically, the noble metal-coated silver wire with the final wire diameter is continuously passed through an electric furnace set to an appropriate temperature, or the noble metal-coated silver wire with the final wire diameter wound on a spool or the like is left in an oven set to an appropriate temperature for a certain period of time.

When ball bonding is performed using a noble metal-coated silver bonding wire for ball bonding produced by the production method according to the embodiment of the present invention, a gold-palladium distribution layer is formed on the FAB surface, thereby exhibiting an excellent characteristic that it can suppress energization failure caused by the corrosion of intermetallic compounds formed between the aluminum pad and the bonding wire. Further, the use of the noble metal-coated silver bonding wire for ball bonding according to the present invention makes it possible to realize a semiconductor device with a longer life than conventional semiconductor devices.

Figure 3:
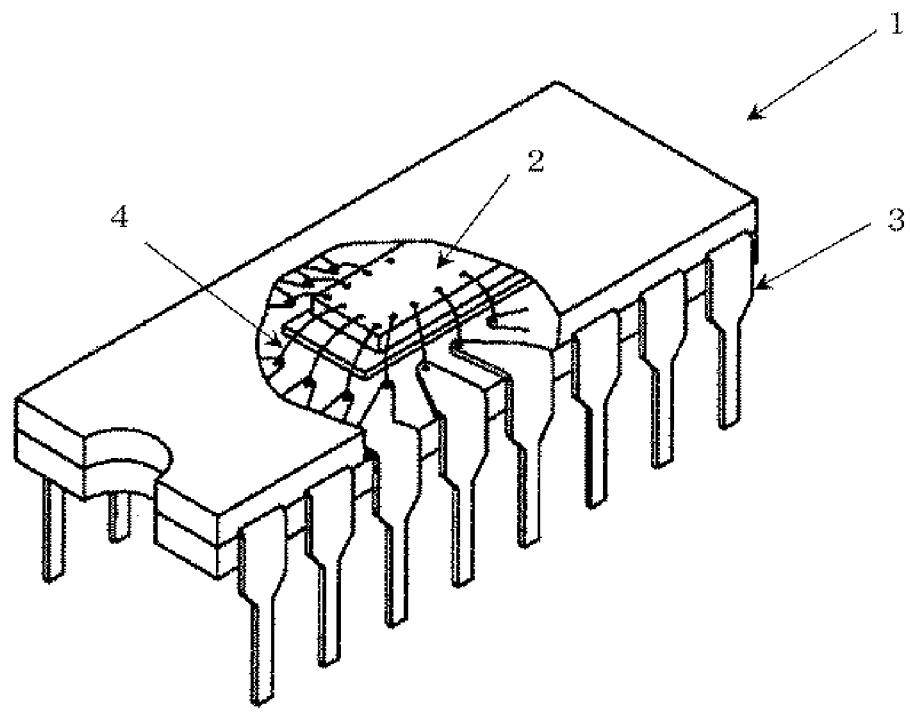
FIG. 3 is a structural diagram of a semiconductor device according to an embodiment of the present invention.

Typical examples of a semiconductor device according to an embodiment of the present invention and a method for producing the same will be described with reference to FIG. 3.

A semiconductor chip 2 and lead frames 3 are bonded by a noble metal-coated silver bonding wire 4, followed by sealing with a ceramic or mold resin to protect the noble metal-coated silver bonding wire 4 and the bonding portions. Then, external leads are molded into a predetermined shape. Finally, product inspection such as electrical characteristic inspection and visual inspection, and reliability inspection such as an environmental test and a life test are performed, after which a semiconductor device 1 is obtained.

Figure 4:
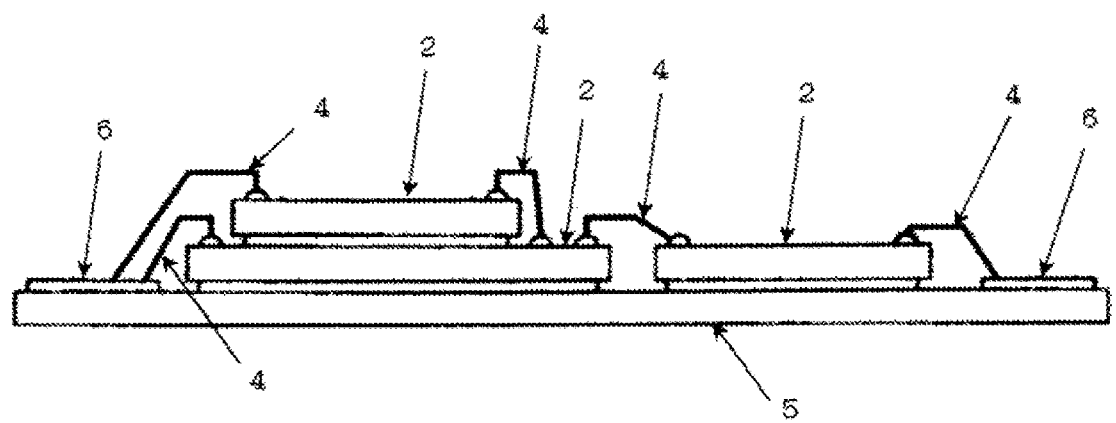
FIG. 4 is an internal structural diagram of a semiconductor device according to another embodiment of the present invention.

Next, the internal structure of a semiconductor device according to another embodiment of the present invention will be described with reference to FIG. 4.

Multiple semiconductor chips 2 are arranged on a substrate 5, and electrodes 6 of the substrate 5 and electrodes (not shown) of the semiconductor chips 2, and electrodes (not shown) of the semiconductor chips 2 and electrodes (not shown) of the semiconductor chips 2 are electrically bonded by a noble metal-coated silver wire 4. The electrodes of the semiconductor chips 2 electrically bonded by the noble metal-coated silver wire 4 also include bumps (not shown) previously bonded to the electrodes on the semiconductor chips 2. Specifically, semiconductor devices refer to logic ICs, analog ICs, discrete semiconductors, memories, optical semiconductors, and the like.

The present invention will be further described below while showing Examples and Comparative Examples; however, the present invention is not limited to the following Examples as long as the gist thereof is not exceeded.

EXAMPLES

First, the Examples will be described. Silver with a purity of 99.9 mass % or more was used for a core material, and gold and palladium were used for a noble metal coating layer. In the method used herein, a noble metal coating layer was laminated on a silver wire with an intermediate wire diameter, followed by continuous drawing to process the wire to a final wire diameter. The method for forming the noble metal coating layer on the surface of the core material was an electroplating method in which the wire was continuously fed and immersed in a plating bath. Then, the bonding wire processed to the final wire diameter was subjected to a final heat treatment. In this manner, bonding wires of Examples 1 to 20 were produced.

Next, FAB was formed on the produced bonding wires using a commercially available bonding device (K&S ICONN) without using gas. First bonding was performed on an aluminum alloy pad on a Si chip for evaluation heated to 200° C. by an ultrasonic thermocompression ball bonding method. Second bonding was performed between silver-plated leads on lead frames (200 pins) made of 42 alloy by an ultrasonic thermocompression stitch-bonding method, thereby connecting 200 wires in total. Thereafter, various evaluations were performed.

(Bonding Evaluation)

Since the influence of spitting appears as bonding failure in the first bonding for thermocompression bonding to the aluminum pad, which is the electrode of the semiconductor chip, the bonding evaluation is performed for the first bonding. First, as the bonding evaluation, wires that could not be continuously ball-bonded due to the detection of non-stick on pad (NSOP) during the first bonding were evaluated as "X" (failed). Next, using a universal bond tester (model BT-4000, produced by Dage), a pull hook was hung on wires that could be continuously ball-bonded around ⅕ of the first bonding side of the entire loop length, and pull evaluation was performed on 20 wires among the 200 connected wires. In the first bonding evaluation, when pressured-bonded ball peeling (peeling from the aluminum pad) occurred even in one wire, this case was evaluated as "X" (failed), and when all of the 20 wires were broken by causes other than pressured-bonded ball peeling, this case was evaluated as "○" (passed). The results are shown in Table 1. Table 1 shows the results of noble metal-coated silver wires. The bonding evaluation was "○" (passed) in all of the Examples, as shown in Table 1.

(Evaluation of Circularity)

The circularity of the pressured-bonded balls is evaluated by the ratio of Y/X, where Y is the vertical diameter (in the direction of applying ultrasonic waves) of the pressured-bonded ball in the bonding wire bonding device, and X is the horizontal diameter (in the direction orthogonal to the ultrasonic wave-applying direction). The evaluation criteria were as follows: "○" (passed) if 0.8 to 1.2, and "X" (failed) if 0.79 or less or 1.21 or more. However, even if the circularity was "○" (passed), the evaluation of circularity was "X" (failed) for wires with a core dislocation phenomenon. The core dislocation phenomenon is a phenomenon in which the pressured-bonded ball is formed asymmetrically with respect to the wire axis. If there is large core dislocation, the ball comes into contact with the adjacent ball to cause a short circuit failure. In addition, core dislocation may also cause insufficient bonding strength. The circularity evaluation for the pressured-bonded ball shape of the bonded wires of the Examples was "○" (passed), as shown in Table 1.

Thereafter, the ball bonding wire bonded to the aluminum alloy pad was sealed with a commercially available epoxy resin, and electric resistance was measured. The electric resistance was measured using a "Source Meter (model 2004)" produced by KEITHLEY, a dedicated IC socket, and a specifically constructed automatic measurement system, using the DC four-terminal method in which a constant current was supplied from probes to adjacent external leads (pairs in which the pad on the semiconductor chip was short-circuited were selected), and the voltage between the probes was measured.

(HAST Reliability Evaluation)

Next, a highly-accelerated temperature and humidity stress test (HAST) was performed. The HAST reliability evaluation was performed in such a manner that the wire produced above was placed in a HAST device and left for 192 hours in an atmosphere of a temperature of 130° C., a relative humidity of 85%, and 2 atm. Thereafter, the electric resistance was measured and evaluated by the rate of increase of electric resistance before the test. The reason for selecting this evaluation method is that, depending on the progress of the formation of a corrosion layer at the bonding interface caused by the corrosion of intermetallic compounds between silver and aluminum formed at the aluminum bonding interface of the wire, the bonding area is reduced, the electrical conductivity decreases, and the electric resistance increases. Therefore, measuring the rate of increase of electric resistance of the wire before and after HAST is suitable as an evaluation method for solving the problems.

Table 1 shows the results. Wires with an average rate of increase of electric resistance of 20% or less between 100 pairs of adjacent external leads before and after HAST were evaluated as "○" (passed), and wires with an average rate of increase of electric resistance exceeding 20% were evaluated as "X" (failed). In all of the wires of the Examples, the average rate of increase of electric resistance after HAST was 20% or less, compared with that before HAST.

Thereafter, when the cross section of the bonding interface between the aluminum alloy pad on the evaluation chip and the wire was analyzed by EDX attached to SEM, palladium was detected at the bonding interface. The detected palladium is derived from the gold-palladium distribution layer formed on the FAB surface shown in FIG. 1. That is, because the gold-palladium distribution layer covering the FAB surface is bonded to the aluminum alloy pad, the formation of silver-aluminum intermetallic compounds is suppressed, and the gold-palladium distribution layer suppresses the corrosion of the intermetallic compounds due to water and chlorine, thereby contributing to the suppression of an increase in electric resistance.

Comparative Examples

Noble metal-coated silver wires of Comparative Examples were produced in the same manner as in the Examples. When FAB was formed on the bonding wires of the Comparative Examples without using gas, as in the Examples, the bonding evaluation was "○" (passed) in Comparative Examples 21 to 28; however, in all of Comparative Examples 29 to 40, non-bonding or bonding failure was observed, and the bonding evaluation was "X" (failed). These results reveal that the bondability is attributable to the gold content (mass %) when gas is not used. Further, distorted eccentric balls were formed in Comparative Examples 23, 24, 26, and 27, and the evaluation of circularity was "X" (failed). These results reveal that the circularity is attributable to the palladium content (mass %) and the sulfur group element content (mass %). The bonding wires that were evaluated as "X" (failed) in the bonding evaluation were not evaluated for circularity and HAST reliability, and they were thus expressed as "-" (not performed) in Table 1. Moreover, the bonding wires that were evaluated as "X" (failed) in the circularity evaluation were not evaluated for HAST reliability, and they were thus expressed as "-" (not performed) in Table 1.

Comparative Examples 21, 22, 25, and 28 passed the evaluation of circularity; however, the rate of increase of electric resistance after HAST exceeded 20% as compared with that before HAST, and they were thus evaluated as "X" (failed). When the cross section of the bonding interface between the aluminum alloy pad on the evaluation chip and the bonding wire was analyzed by EDX attached to SEM, palladium was not detected at the bonding interface. These results reveal that the detection of palladium at the bonding interface, i.e., coating of the FAB surface with a gold-palladium distribution layer, depends on the palladium content (mass %) and the amount of sulfur group element added. It is also revealed that the presence of palladium at the bonding interface is the key to solving the problems of the present invention.

TABLE 1

|         |    | Au (mass %) | Pd (mass %) | Sulfur group element (mass ppm) | | | Bonding evaluation | Circularity evaluation | HAST reliability evaluation | Final evaluation |
|---------|----|-------------|-------------|---|---|---|--------------------|------------------------|-----------------------------|------------------|
|         |    |             |             | S | Se | Te |                    |                        |                             |                  |
| Example | 1  | 3.8 | 1.4  | 6  | —  | —   | ○ | ○ | ○ | ○ |
|         | 2  | 1.5 | 0.5  | —  | 4  | —   | ○ | ○ | ○ | ○ |
|         | 3  | 1.0 | 0.2  | —  | —  | 5.5 | ○ | ○ | ○ | ○ |
|         | 4  | 2.8 | 0.7  | 3  | —  | —   | ○ | ○ | ○ | ○ |
|         | 5  | 1.0 | 0.05 | —  | 0.5 | —  | ○ | ○ | ○ | ○ |
|         | 6  | 3.3 | 1.3  | —  | —  | 30  | ○ | ○ | ○ | ○ |
|         | 7  | 4.4 | 1.7  | 10 | 10 | —   | ○ | ○ | ○ | ○ |
|         | 8  | 5.8 | 2.8  | —  | 11 | 24  | ○ | ○ | ○ | ○ |
|         | 9  | 4.0 | 1.0  | 6  | 8  | —   | ○ | ○ | ○ | ○ |
|         | 10 | 5.7 | 3.5  | 10 | —  | 18  | ○ | ○ | ○ | ○ |
|         | 11 | 3.5 | 2.9  | 4  | 7  | 22  | ○ | ○ | ○ | ○ |
|         | 12 | 1.0 | 0.02 | —  | —  | 0.5 | ○ | ○ | ○ | ○ |
|         | 13 | 5.2 | 2.0  | —  | 19 | —   | ○ | ○ | ○ | ○ |
|         | 14 | 5.5 | 4.8  | —  | —  | 87  | ○ | ○ | ○ | ○ |
|         | 15 | 5.3 | 2.6  | 4  | 6  | 20  | ○ | ○ | ○ | ○ |

TABLE 1-continued

|  |  | Au (mass %) | Pd (mass %) | Sulfur group element (mass ppm) | | | Bonding eval-uation | Circularity eval-uation | HAST reliability eval-uation | Final eval-uation |
|---|---|---|---|---|---|---|---|---|---|---|
|  |  |  |  | S | Se | Te |  |  |  |  |
|  | 16 | 2.4 | 0.5 | 3 | — | — | ○ | ○ | ○ | ○ |
|  | 17 | 3.0 | 1.0 | — | 9 | — | ○ | ○ | ○ | ○ |
|  | 18 | 4.5 | 1.5 | — | — | 35 | ○ | ○ | ○ | ○ |
|  | 19 | 5.5 | 2.1 | 7 | 12 | — | ○ | ○ | ○ | ○ |
|  | 20 | 4.8 | 2.5 | — | 7 | 20 | ○ | ○ | ○ | ○ |
| Comparative Example | 21 | 1.0 | 0.005 | — | — | — | ○ | ○ | X | X |
|  | 22 | 3.4 | 0.8 | — | — | — | ○ | ○ | X | X |
|  | 23 | 5.0 | 5.5 | — | — | — | ○ | X | — | X |
|  | 24 | 10.0 | 4.5 | 24 | — | — | ○ | X | — | X |
|  | 25 | 3.8 | 1.4 | 0.01 | — | — | ○ | ○ | X | X |
|  | 26 | 4.2 | 2.8 | — | 86 | 37 | ○ | X | — | X |
|  | 27 | 5.6 | 5.2 | — | — | 120 | ○ | X | — | X |
|  | 28 | 1.0 | 0.008 | — | — | 0.2 | ○ | ○ | X | X |
|  | 29 | 0.33 | 1.4 | 6 | — | — | X | — | — | X |
|  | 30 | 0.05 | 0.5 | — | 4 | — | X | — | — | X |
|  | 31 | 0.13 | 0.2 | — | — | 5.5 | X | — | — | X |
|  | 32 | 0.39 | 0.7 | 3 | — | — | X | — | — | X |
|  | 33 | 0.26 | 0.05 | — | 0.5 | — | X | — | — | X |
|  | 34 | 0.02 | 1.3 | — | — | 30 | X | — | — | X |
|  | 35 | 0.88 | 1.7 | 10 | 10 | — | X | — | — | X |
|  | 36 | 0.73 | 2.8 | — | 11 | 24 | X | — | — | X |
|  | 37 | 0.21 | 1.0 | 6 | 8 | — | X | — | — | X |
|  | 38 | 0.84 | 2.2 | 10 | — | 18 | X | — | — | X |
|  | 39 | 0.43 | 2.9 | 4 | 7 | 22 | X | — | — | X |
|  | 40 | 0.01 | 0.02 | — | — | 0.5 | X | — | — | X |

The results of the Examples and Comparative Examples above demonstrate that the presence of palladium at the bonding interface between the aluminum alloy pad on the evaluation chip and the bonding wire has a great influence on the electrical conductivity of the bonding wire, i.e., bonding life. The palladium at the bonding interface is derived from the gold-palladium distribution layer formed on the FAB surface shown in FIG. 1.

As described above, because the gold-palladium distribution layer stably remains on the FAB surface, it is possible to provide a noble metal-coated silver bonding wire that can suppress an increase in electric resistance, i.e., energization failure, caused by corrosion occurring at the bonding interface, even under severe conditions of high temperature and high humidity in automobiles and the like.

In addition, the noble metal-coated silver wire for ball bonding according to the present invention can exhibit an excellent characteristic that it can suppress energization failure caused by the corrosion of intermetallic compounds formed between the aluminum pad and the bonding wire. Therefore, the use of the noble metal-coated silver bonding wire for ball bonding of the present invention in a semiconductor device makes it possible to provide a semiconductor device having a longer life than conventional semiconductor devices.

INDUSTRIAL APPLICABILITY

The noble metal-coated silver wire for ball bonding according to the present invention replaces conventional gold wires and palladium-coated silver wires, suppresses an increase in electric resistance even under high-humidity and high-temperature conditions and has uses in various applications such as logic ICs, analog ICs, discrete semiconductors, and memories, as well as optical semiconductors.

EXPLANATION OF REFERENCE SIGNS

1 Semiconductor device
2 Semiconductor chip
3 Lead frame
4 Noble metal-coated silver wire
5 Substrate
6 Electrode

The invention claimed is:

1. A noble metal-coated silver wire for ball bonding, comprising a noble metal coating layer on a core material made of pure silver or a silver alloy,
   wherein
   the noble metal coating layer comprises a palladium intermediate layer and a gold skin layer, and contains at least one sulfur group element,
   a content of the palladium relative to an entire wire is between 0.01 mass % or more and 5.0 mass % or less,
   a content of the gold content relative to the entire wire is between 1.0 mass % or more and 6.0 mass % or less, and
   a content of the sulfur group element relative to the entire wire is between 0.1 mass ppm or more and 100 mass ppm or less.

2. The noble metal-coated silver wire for ball bonding according to claim 1, wherein the noble metal coating layer further comprises a gold intermediate layer on a core material surface of the palladium intermediate layer.

3. The noble metal-coated silver wire for ball bonding according to claim 1, wherein the core material further contains copper, and a copper content relative to the entire wire is between 0.005 mass % or more and 2.0 mass % or less.

4. A semiconductor device comprising at least one semiconductor chip and a lead frame or a substrate, in which an electrode of the semiconductor chip and an electrode of the lead frame, the electrode of the semiconductor chip and an electrode of the substrate, or electrodes of multiple semiconductor chips are connected by a noble metal-coated silver wire for ball bonding,
   wherein the noble metal-coated silver wire for ball bonding comprises a noble metal coating layer on a core material made of pure silver or a silver alloy, and contains at least one sulfur group element, the noble metal coating layer comprises a palladium intermediate layer and a gold skin layer, and contains at least one sulfur group element, a content of the palladium relative to an entire wire is between 0.01 mass % or more and 5.0 mass % or less, a content of the gold relative to the entire wire is between 1.0 mass % or more and 6.0 mass % or less, and a content of the sulfur group element relative to the entire wire is between 0.1 mass ppm or more and 100 mass ppm or less.

5. The semiconductor device according to claim 4, wherein in the noble metal-coated silver wire for ball bonding, the noble metal coating layer further comprises a gold intermediate layer on a core material surface of the palladium intermediate layer.

6. The semiconductor device according to claim 4, wherein in the noble metal-coated silver wire for ball bonding, the core material further contains copper, and a content of the copper relative to the entire wire is between 0.005 mass % or more and 2.0 mass % or less.

7. The noble-metal coated silver wire for ball bonding according to claim 1, wherein the palladium intermediate layer contains at least one sulfur group element.

8. The noble-metal coated silver wire for ball bonding according to claim 7, wherein the at least one sulfur group element includes sulfur, selenium and tellurium.

9. The noble-metal coated silver wire for ball bonding according to claim 4, wherein the palladium intermediate layer contains at least one sulfur group element.

10. The noble-metal coated silver wire for ball bonding according to claim 9, wherein the at least one sulfur group element includes sulfur, selenium and tellurium.

* * * * *